(12) United States Patent
Karppanen

(10) Patent No.: US 7,813,124 B2
(45) Date of Patent: Oct. 12, 2010

(54) ELECTRONIC INFORMATION BOARD

(75) Inventor: Pasi Karppanen, Kajaani (FI)

(73) Assignee: Symbicon Oy, Kajaani (FI)

( * ) Notice: Subject to any disclaimer, the term of this patent is extended or adjusted under 35 U.S.C. 154(b) by 132 days.

(21) Appl. No.: 12/297,164

(22) PCT Filed: Feb. 22, 2007

(86) PCT No.: PCT/FI2007/050091

§ 371 (c)(1),
(2), (4) Date: Dec. 16, 2008

(87) PCT Pub. No.: WO2007/116125

PCT Pub. Date: Oct. 18, 2007

(65) Prior Publication Data

US 2009/0279240 A1 Nov. 12, 2009

(30) Foreign Application Priority Data

Apr. 11, 2006 (WO) .................. PCT/FI2006/050145

(51) Int. Cl.
G06F 1/16 (2006.01)
(52) U.S. Cl. .................. 361/679.56; 349/110; 345/679; 165/185; 248/917
(58) Field of Classification Search ............ 361/679.21, 361/679.46, 679.01, 679.56, 679.27, 679.47; 349/58, 59, 60, 110; 165/104.32, 185, 56; 345/1.3, 173, 88, 679; 312/223.1, 223.2, 312/223.3; 248/917, 920, 924; 211/189; 455/575.3, 575.4, 575.5

See application file for complete search history.

(56) References Cited

U.S. PATENT DOCUMENTS

| 5,991,153 | A | 11/1999 | Heady et al. |
| 6,104,451 | A | 8/2000 | Matsuoka et al. |
| 6,504,713 | B1 | 1/2003 | Pandolfi et al. |

(Continued)

FOREIGN PATENT DOCUMENTS

EP 1253459 10/2002

(Continued)

OTHER PUBLICATIONS

"Going big with TFT LCD", http://www.hightechfinland.com/2006/communications/software/en_GB/imagon/, Nov. 30, 2006.

(Continued)

Primary Examiner—Hung V Duong
(74) Attorney, Agent, or Firm—Young & Thompson

(57) ABSTRACT

An electronic information board includes a frame, a flat display element and electronic equipment for controlling the display element. The information board includes a display casing for the display element and a device casing for the electronic equipment, such as a control unit and power supply. The display element is supported preferably with flexible support elements to the display casing so that there is a gap between the front and back surfaces of the display element and the walls of the display casing enabling the circulation of air. Cooling system transfers heat from the display casing and the device casing to the outside of the casings. The cooling system includes circulating fans placed in the fan casing with which an air flow is generated through the display casing and the device casing.

18 Claims, 2 Drawing Sheets

U.S. PATENT DOCUMENTS

Figure 1:
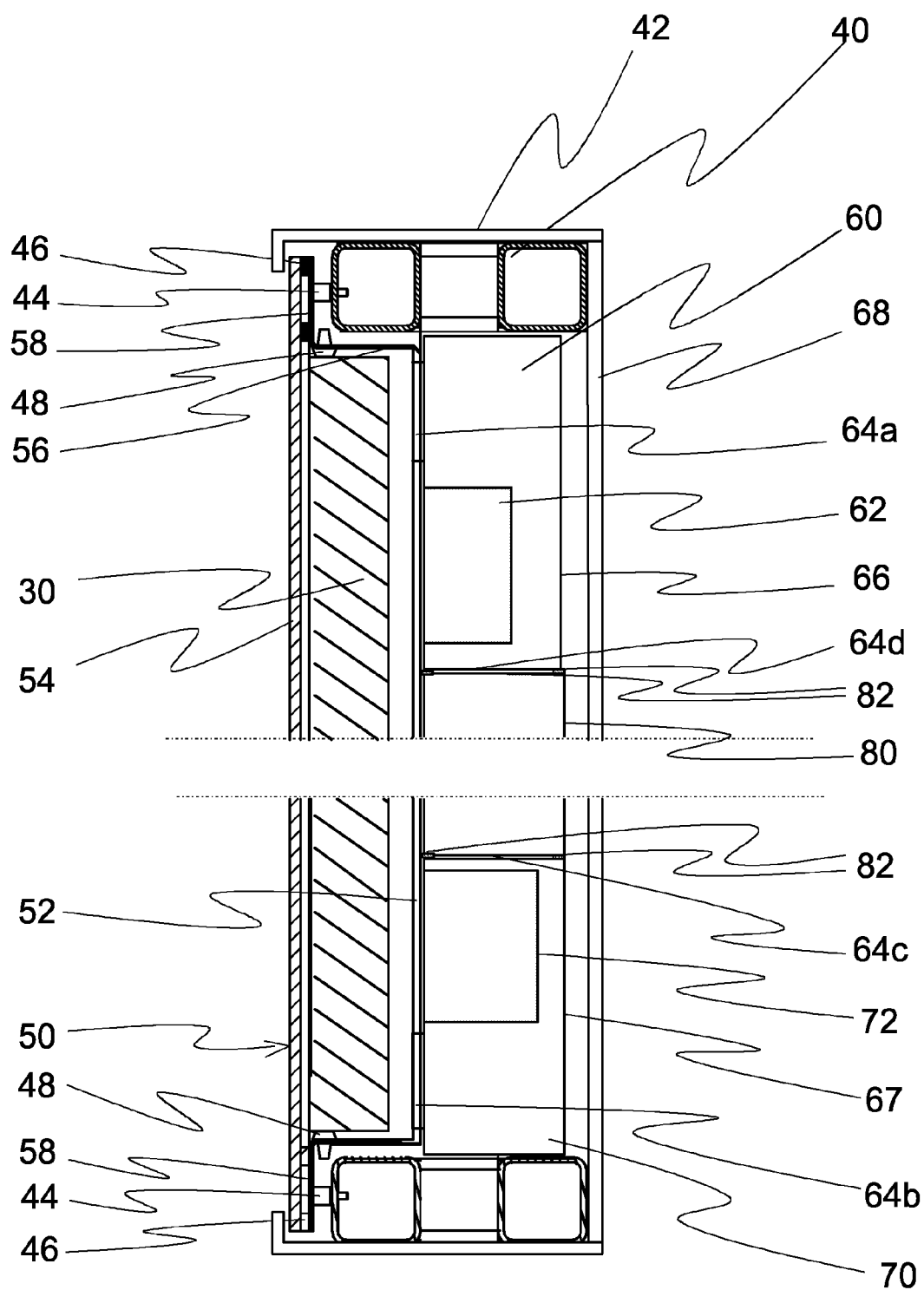

| | | | |
|---|---|---|---|
| 7,457,120 B2 * | 11/2008 | Bae et al. | 361/704 |
| 7,595,983 B2 * | 9/2009 | Okuda | 361/679.56 |
| 2008/0210843 A1 * | 9/2008 | Han et al. | 248/917 |
| 2009/0021126 A1 * | 1/2009 | Chou et al. | 312/223.1 |

FOREIGN PATENT DOCUMENTS

| | | |
|---|---|---|
| FR | 2817700 | 6/2002 |
| GB | 2387472 | 10/2003 |
| JP | 7319402 | 12/1995 |
| JP | 8054834 | 2/1996 |
| JP | 10222076 | 8/1998 |
| JP | 2004029290 | 1/2004 |
| JP | 2005084270 | 3/2005 |
| JP | 2005134849 | 5/2005 |
| JP | 2005196000 | 7/2005 |
| JP | 2005265922 | 9/2005 |
| JP | 2005338541 | 12/2005 |
| JP | 2006011314 | 1/2006 |

OTHER PUBLICATIONS

Google's cache of http://www.hightechfinland.fi/2006/en_GB/frontpage_14/, Feb. 27, 2006.

International search report in corresponding PCT/FI2006/050145 (priorty of PCT/FI2007/050091).

International search report in corresponding PCT/FI2007/050091.

* cited by examiner

ELECTRONIC INFORMATION BOARD

An electronic information board comprising a frame, a flat display element for presenting information and electronic equipment for controlling the operation of the information board.

The conventional means used by advertisers to pass on information are illuminated advertisement boards containing a paper poster, which are updated by replacing the poster with a new one. Replacing the poster is laborious, and it may take place at intervals of several weeks or even days. New posters have to be printed, transported, replaced and finally disposed of. The changing of the posters thus causes unnecessary stress on the environment and costs. The problems entailed by paper posters are avoided by using electronic information boards instead of them.

The display of an electronic information board can be implemented by using any known display device technology. For the present, the most advantageous display technology for display devices of a few square meters and less is the TFT LCD technology which provides the advantages of a large viewing angle, a short response time, good contrast and reliability of the display. In addition to TFT LCD displays, other electronic display solutions, such as plasma displays, can be used in information boards.

TFT LCD displays are used to some extent in the implementation of public electronic information boards. The problem is that when used in environments having high temperatures, the temperatures of the display devices easily rise too high. On the other hand, in cold environments there is the danger that the temperatures of the display devices fall too low. In both operation situations it is important that the temperatures at different points inside the display device can be kept as constant as possible. Then the display device operates in the widest possible range of operating temperatures, and local temperatures do not cause exceeding of the specifications given to the display element.

In the present devices, the warming of the display in cold conditions has often been solved by a transparent warming resistor fastened to the transparent window of the device. In this solution, the problem is the high price of components, because the manufacture of a transparent warming element requires special solutions. Also, the supply of electricity to the warming element attached to the glass generally requires the use of a low voltage and a so-called SELV connection device because of the risk of the glass being broken. Providing a SELV low voltage causes power losses and increases the costs when the number of power supplies increases. A transparent warming element fastened to the glass only heats the display on the front side, and the fluorescent tubes inside the display operate in considerably colder conditions than the TFT LCD matrix. The efficiency of fluorescent tubes used in connection with display devices generally weakens radically when the temperature falls, and therefore the brightness of the display may be significantly reduced in cold conditions.

Another solution for warming the display device is to heat it from behind by various warming resistors and corresponding arrangements. These solutions, again, entail the problem that the TFT LCD matrix on the front surface of the display may then operate in too cold conditions, whereby the response time of the display increases. In the worst case, the temperature of the TFT LCD matrix may fall below the storage temperature allowed for the display.

With regard to the cooling of information boards, the known solutions have the drawback that the displays are cooled by forced convection only from behind. However, the display elements produce heat in every direction. Most of the heat in plasma displays is generated on the side of the visible surface of the display. Therefore, the present display casings having a transparent window result in a significant rise of temperature in the upper parts of the display especially on the visible side of the display. In addition, the present solutions have the problem of temperature control caused by the integration of the electronics controlling the display and the actual display. As a result, there are often situations in which heat is cumulated in certain parts of the device when components that are warming increase the temperatures of each other. If the design has not been critically checked, temperatures may become too high locally.

Because of the inadequate cooling and warming solutions, the operating life of electronic information boards remains shorter than normal, or they are unnecessarily damaged. For example, the LCD matrix of TFT LCD display elements becomes inoperative already at the temperature of 70° C. If the temperatures cannot be made constant in different parts of the display element, the temperatures of the upper parts set a limit to the highest possible operating temperature allowed for the whole display device. The probability of the electronics of the device getting damaged in the hottest parts of the device also increases significantly. Because of the problems related to the temperature control of electronic information boards, they are poorly suited for use in variable conditions, such as outdoors, where the differences of temperature at day and night and especially at different times of the year are very high. Because of this, electronic information boards are hardly ever used outdoors, but the conventional illuminated boards containing a paper poster are used instead.

It is an objective of the invention to provide an electronic information board, by which the drawbacks and shortcomings related to the temperature control of the prior art electronic information boards can be significantly reduced. Another objective of the invention is to provide an electronic information board which tolerates well external variations of temperature and is thereby suitable for installation outdoors. In addition, it is an objective of the invention to provide an electronic information board, by which a conventional illuminated board containing a paper poster can be replaced.

The objectives of the invention are achieved by an electronic information board which is characterized in what is set forth in the independent claim. Some preferred embodiments of the invention are presented in the dependent claims.

The invention relates to an electronic information board comprising a frame, a flat display element, such as a TFT LCD display or plasma display, for displaying information, and electronic equipment for controlling the display element. The basic idea of the invention is that the display element and the electronics required for controlling the information board are located separately from each other for facilitating the arrangements for temperature control and cooling of the information board. As a result, the information board has a modular structure, which also facilitates the maintenance and updating of the device. The information board has its own display casing for the display element and a device casing for the electronic equipment needed for controlling the information board. Means have also been arranged in the information board for arranging closed cooling air circulation through the display casing and the device casing in order to transfer heat from the casings to the outside of them. Preferably, the device casing contains at least a control unit of the information board, a power supply of the control unit and a power supply of the background light of the display.

In a preferred embodiment of the invention, the display casing comprises a transparent front plate, an edge part and a back wall. The display element has been supported to the display casing by preferably flexible support elements so that between the front surface of the display element and the front plate as well as the back surface of the display element and the back wall there is a gap enabling circulation of air. The front plate is preferably made of shock-resistant glass.

In another preferred embodiment of the invention, said cooling system comprises at least one circulating fan for forming an air flow through the display casing and the device casing. Preferably there are several circulating fans and they have been placed in a separate fan casing. The air flowing through the display and device casing "rinses" the surfaces of the electronic devices and the display element, whereupon heat transfers effectively from these devices into the air flowing by. Thanks to the placement of the display element, the air can flow on its both sides, whereby the cooling of the display is effective.

In a third preferred embodiment of the invention, said cooling system further comprises a cooling device for cooling the air flowing through the display casing and the device casing. Preferably the cooling device is a cross-flow cell in which there are first air ducts running in the first direction of flow and second air ducts running in the second direction of flow. The cooling system has preferably been implemented so that the device casing has-been fastened to the upper part of the display casing's back wall, fan casing has been attached to the lower part of the display casing's back wall and the cross-flow cell has been placed between the device casing and the fan casing. In the walls of the display casing, device casing and fan casings, flow holes have been arranged with the help of which is formed a closed air flow passage leading from the fan casing through the cross-flow cell to the device casing, from the device casing to the display casing and from the display casing to the fan casing. Thanks to the closed flow passage, no impurities can get to the air circulating in the device and display casings that could harm the operation of the information board.

In a fourth preferred embodiment of the invention there is further at least one cooling fan for generating an air flow along the second air ducts of the cross-flow cell which cools the cross-flow cell. In this embodiment there are ventilation slots on the opposite sides of the information board for enabling air flow from the outside of the information board to the cross-flow cell and back to the outside of the information board.

In a fifth preferred embodiment of the invention there is further a heating device, such as an electric resistance, for heating the air flowing through the display casing and the device casing. Preferably this heating device is placed in the fan casing. The heating device enables the placing of the information board according to the invention also in cold outdoor locations.

An advantage of the invention is that the cooling and warming of the information board can be implemented very cost-efficiently. It is possible to use low-cost standard elements in warming, in which case special warming resistors to be integrated in the glass are not required.

A further advantage of the invention is that the display element of the information board can be easily changed when required, because the temperature control of the display is not based on conduction of the heat from certain physical points of the display.

Yet another advantage of the invention is that due to the effective temperature control, it is possible to use large electronic displays in the information board, the external dimensions of the displays corresponding to the external dimensions of the paper posters used in the illuminated boards. In addition, the total depth of the information board is essentially the same or even smaller than in the illuminated boards.

Because the physical size of an information board according to the invention is essentially the same as the size of illuminated paper poster boards, the replacement of a conventional illuminated board by an information board according to the invention does not require new permissions from the authorities and long permission procedures.

Furthermore, the invention has the advantage that it can be implemented both as a one-sided and a two-sided information board. A two-sided information board is formed by joining together two one-sided information boards. As an alternative, the other side of the information board can be a conventional, illuminated poster board.

Yet another advantage of the invention is that it is suitable for use both outdoors and indoors. The electronic display and the electronics related to the operation of the display device have been placed in their own separate casings, the enclosure class of which enables maintenance measures performed outdoors and easy updating of the device.

In the following, the invention will be described in detail. Reference will be made to the accompanying drawings, in which FIG. 1 shows as an example a cross-sectional drawing of an electronic information board according to the invention, and FIG. 2 shows as an example a perspective drawing, depicted obliquely from behind, of an electronic information board according to the invention.

Figure 2:
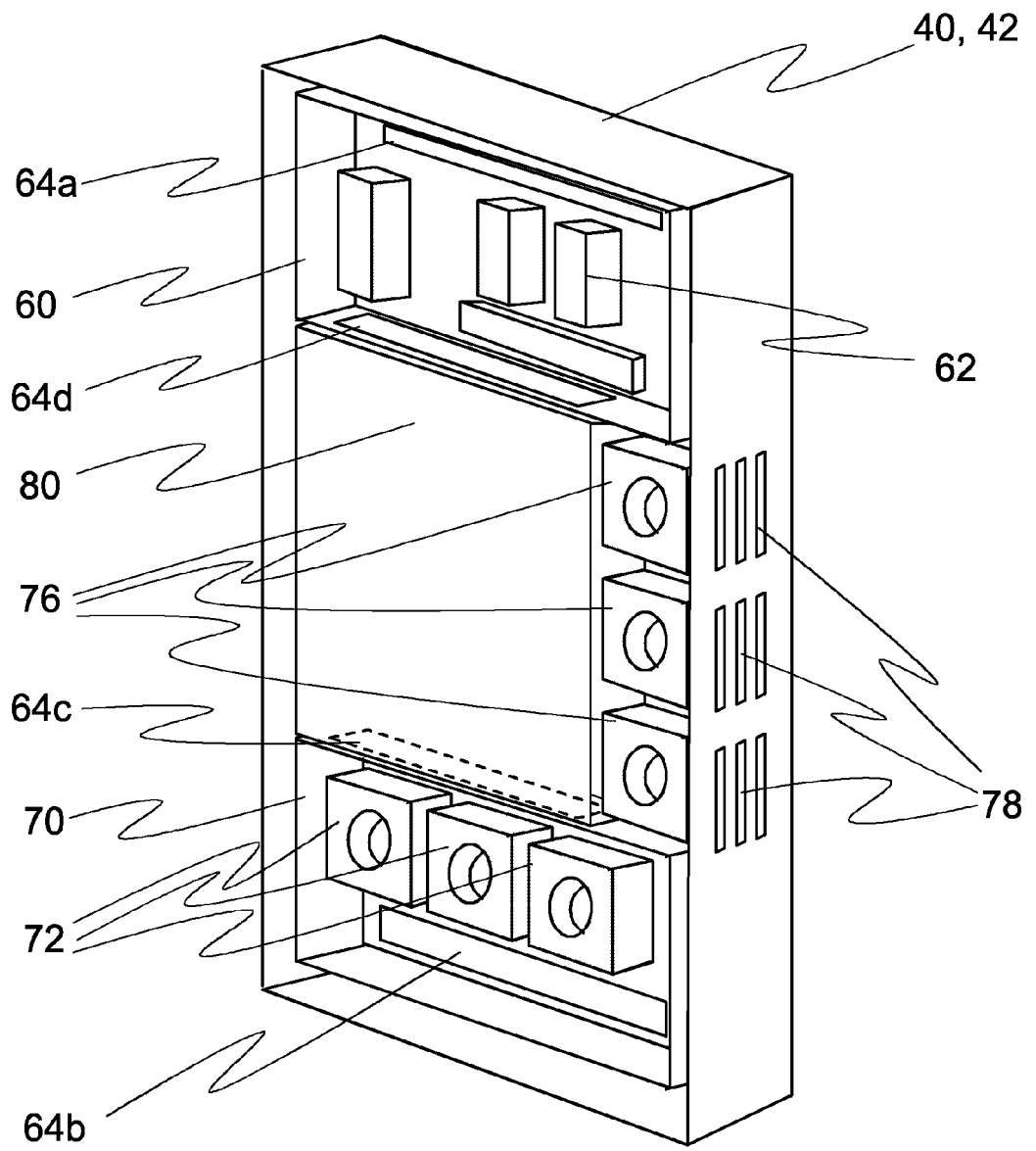

In FIG. 1, an example of an electronic information board according to the invention is shown as a cross-sectional drawing. The information board has a frame 40 manufactured of metal piping, to the edge surface of which a lining plate 42 forming the visible outer surface has been fastened. The lining plate is preferably made of aluminium or steel. A display casing 50 comprising a back wall 52, a transparent front plate 54 and an edge part 56 having a flange-like fastening collar 58 running in the direction of the front plate has been fastened to the frame by fastening means 44. Preferably, the back wall and the edge parts have been formed of one plate-like part by some known plate machining method, such as pressing. The transparent front plate has been fastened to the fastening collar of the edge parts by means of flexible, vibration attenuating sealing elements 46 so that the edge parts of the front plate and the back wall form a closed display casing. The front plate is preferably made of shock-resistant glass, but it is also possible to use other materials. The transparent front plate of the display casing forms the front surface of the information board. The back surface of the information board is formed by a back cover 68 which has been attached to the frame 40 so that it can be detached or opened. Preferably the back cover has been attached to the frame by screw-on attachment or it is hinged.

Inside the display casing there is a display element 30 which has been supported at its edges by support elements 48 to the edge part of the display casing in such a way that there remains a gap enabling the circulation of air between the walls of the display casing and the outer surface of the display element. The display element is preferably a TFT LCD display which withstands static information significantly better than other display techniques. However, the display element can also be some other suitable, flat electronic display element, such as a plasma display, a LED display or an organic LED display.

Inside the frame 40 there is a device casing 60 fastened to the upper part of the back wall 52 of the display casing 50, inside of which device casing has been placed essentially all electronic equipment 52 required for controlling the display element 30 and the whole information board, such as a computer, a control unit of the display and power supplies of the control unit and the display's background light. In the upper part of the display casing's back wall, opening to the device casing, there is a first flow hole 64a through which air can flow from the device casing to the display casing 50. The device casing has a detachably attached back wall 66 which can be opened for the duration of the maintenance of the information board.

Separating the display element and the control electronics from each other and placing them in casings of their own makes the temperature control and arranging the cooling easier. At the same time, the structure of the information board becomes modular, which makes the manufacturing of the device simpler and faster and conducting the maintenance and updating easier.

To the lower part of the display casing's 50 back wall 52 has been fastened a fan casing 70 inside of which are placed circulating fans 72. In the bottom part of the display casing's back wall, opening to the fan casing, there is a second flow hole 64b through which air can flow from the display casing to the fan casing. Also in the fan casing there is a detachably attached back wall 67 which can be opened for the duration of the maintenance of the information board. Display casing, device casing and fan casings have been formed in such a manner that they allow the placing of the information board in outdoor locations and enable updating and maintenance in outdoor conditions. Preferably the sealing of afore-mentioned casings corresponds to the enclosure class IP 55 of electronic devices at the minimum.

Inside the frame 40, between the device casing 60 and the fan casing 70, there is yet a cross-flow cell 80 through which air can flow from the fan casing 70 to the device casing 60. The cross-flow cell is a heat transfer device known previously inter alia in connection of air supply units in which device there are several first air ducts running in the first direction and several second air ducts running in the second direction. In the information board of FIG. 1, the first air ducts of the cross-flow cell run in the direction of the vertical axis of the information board, whereby air can flow along the first air ducts through the cross-flow cell from the fan casing to the device casing. The second air ducts of the cross-flow cell run horizontally. The structure and operation of the cross-flow cell will be described in more detail in connection with the description of FIG. 2. In order to make the air flow possible, there is a third flow hole 64c in the wall setting against the cross-flow cell 80 of the fan casing 70 and a fourth flow hole 64d in the wall setting against the cross-flow cell 80 of the device casing 60. On the edges of the third and fourth flow hole there are edge seals 82 which secure that the wall of the cross-flow cell sets itself air-tightly against the walls of the device and fan casing.

FIG. 2 depicts an electronic information board according to FIG. 1 as a perspective drawing shown obliquely from behind. In order to better disclose the structure of the device, the back cover of the information board, the back wall of the device casing 60 and the back wall of the fan casing 70 are not shown in the figure. There are circulating fans 72 inside the fan casing with the help of which a closed cooling air circulation is generated through the fan casing 70, cross-flow cell 80, device casing 60 and display casing 50. When the circulating fans are in operation, the air flows from the fan casing through the third flow hole 64c to the cross-flow cell, from the cross-flow cell through the fourth flow hole 64d to the device casing 60, from the device casing through the first flow hole 64a to the upper part of the display casing 50 and through the second flow hole 64b in the lower part of the display casing back to the fan casing, after which a new circuit begins. The walls of the device, display and fan casings are airtight. On the edges of the walls of the cross-flow cells and the third and fourth flow hole of the device casing there are edge seals 82 which secure that wall of the cross-flow cell sets airtightly against the walls of the device and fan casing. This way it has been ensured that the cooling air of the device and display casings circulates the whole time in an internal circulation closed from the outdoor air. The operation of the circulating fans is controlled with a control unit in the device casing.

In the middle part of the information board there is a cross-flow cell 80 the function of which is to cool the air flow flowing through the device and display casing. The cross-flow cell is a heat transfer device known as such and made up of successive planar parts in which there are first air ducts running through in the first flow direction and second air ducts running through in the second flow direction. In the information board of FIG. 2 the first air ducts run in the direction of the vertical axis of the information board and the second air ducts run perpendicularly in respect of the direction of the first air ducts, i.e. in the direction of the horizontal axis. The first and the second air ducts are always located alternately in the cross-flow cell and they share a common partition wall which is made of material that conducts heat well, such as aluminium. The cooling operation of the cross-flow cell is based on the fact that the heat of the air flowing in the first air ducts transfers to the second air ducts via the common partition walls and further to the air flowing in the second air ducts. As a result of the heat transfer, the air flowing in the first air ducts cools as it runs through the cross-flow cell. A prerequisite for the cooling is naturally that the air flowing in the second air ducts is colder than in the first air ducts. The cross-flow cell is fastened detachably, whereby it can be easily removed for the duration of the maintenance and/or cleaning measures if required.

When the information board is in operation, the display element 30 and the electronic devices 62 in the device casing warm up, whereby the temperature of the device casing 60 and the display casing 50 rises. In addition to the own heat production of the devices also the ambient circumstances of the casings, such as the temperature of the location in which they are placed and sunshine, affect their warming up. In an information board according to the invention, a circulating air flow running through the device and display casing is generated with the help on which the temperature of the casings is maintained within desired limits. The circulating air flow rinses the surface of the parts that warm up, such as that of the display element, whereupon the heat transfers effectively from the warming-up components directly to the air flow. In the device and display casing are placed transducers (not shown in the figures) that measure the temperature and are connected to the control unit in the device casing of the information board. The control unit controls the operation of the circulating fans 72 based on the measured temperatures in accordance with a predetermined control logic. With the help of the internal cooling air circulation generated with circulating fans, the temperatures of the inner parts of the display casing and the device casing can be standardized and the heat can be effectively transferred away from the inside of the casings. Thanks to the internal air circulation the heat produced by a point heat source such as a power supply can be effectively and evenly divided into the whole inner space of the casing. The circulation of the inner space air enables the cooling of the edges of the display element especially in the upper parts of the display casing. This is significant especially with TFT LCD displays from the viewpoint of the cooling of the controller circuits of the display. The controller circuits are located right inside the edge of the display element. Without effective cooling their temperatures would rise higher than in the other parts of the display element. Since the controller circuits are made of complicated microelectronics, even a slight decrease in operation temperatures helps considerably to improve their reliability.

To the back wall 52 of the display casing 50 are fastened cooling fans 76 with the help of which a forced air flow is generated through the cross-flow cell along the horizontal second air ducts. In order to enable the air flow, there are ventilation slots 78 in both side walls of the information board which enable the entrance of cool outdoor air in the cross-flow cell and the exit of the air that has warmed up in the cell back to the outdoor air. If required, the ventilation slots may be equipped with filters (not shown in the figures) in order to prevent entry of impurities into the cross-flow cell. Also the operation of the cooling fans is controlled with the control unit in the device casing.

In a preferred embodiment of the information board according to the invention, an electric heat resistor has been placed in the fan casing 70 as well with the help of which the air flowing through the display and device casing can be heated, if required. The operation of the heat resistor is controlled with the control unit in the device casing or with heat resistor's own thermostat. This preferred embodiment of the invention is suited for using under cold conditions in which the heat produced by the electronic components of the information board is not sufficient to reach a suitable operating temperature.

Some preferred embodiments of an electronic information board according to the invention have been described above. The information board can be made according to the user's needs and preferences to the desired size. In particular, the information board can be made to structures of the same size of under 25 cm in depth as the known illuminated advertisement boards, in which case the physical dimensions of the display element correspond to the dimensions generally used in paper posters. Mechanical fastening of the information boards to the support structures can be implemented at the upper or lower edge of the board, from behind or from the sides of the board.

The invention is not limited to the above-described solutions only, but the inventive idea can be applied in numerous ways within the scope defined by the claims.

The invention claimed is:

1. An electronic information board comprising a frame (40), a flat display element (30) for displaying information, electronic equipment (62) for controlling the operation of the information board, a display casing (50), inside of which said display element has been placed, and a device casing (60), inside of which said electronic equipment have been placed, characterized in that:
   in the walls of the display casing and device casing there are flow holes (64a, 64b, 64d) for forming an air flow passage from the device casing to the display casing and from the display casing back to the device casing, and the information board further comprises:
   means for arranging closed circulation of cooling air through the display casing and the device casing and;
   a cooling device for cooling the air flowing through the display casing (50) and the device casing (60).

2. An information board according to claim 1, characterized in that the display casing (50) comprises a transparent front plate (54), an edge part (56) and a back wall (52), whereupon the display element (30) has been supported to the display casing by support elements (48) in such a way that between the front surface of the display element and the front plate as well as the back surface of the display element and the back wall there is a gap enabling the circulation of air.

3. An information board according to claim 2, characterized in that in the device casing (60) there is at least a control unit of the information board, a power supply of the control unit and a power supply of the display's background light.

4. An information board according to claim 1, characterized in that in the device casing (60) there is at least a control unit of the information board, a power supply of the control unit and a power supply of the display's background light.

5. An information board according to claim 1, characterized in that said means for arranging closed circulation of cooling air comprise at least one circulating fan (72) for generating an air flow through the display casing (50) and the device casing (60).

6. An information board according to claim 5, characterized in that it further comprises a fan casing (70) in which said at least one circulating fan (72) has been placed.

7. An information board according to claim 1, characterized in that said cooling device is a cross-flow cell (80) comprising first air ducts running in the first direction of flow and second air ducts running in the second direction of flow.

8. An information board according to claim 7, characterized in that the device casing (60) and the fan casing (70) have been fastened to the back wall (52) of the display casing (50), the cross-flow cell (80) have been placed between the device casing and the fan casing, and in the walls of the display casing, device casing and fan casings there are flow holes (64a, 64b, 64c, 64d) for forming a closed air flow passage leading from the fan casing through the cross-flow cell to the device casing, from the device casing to the display casing and from the display casing to the fan casing.

9. An information board according to claim 7, characterized in that on its opposing sides there are ventilation slots (78) for enabling air flow from the outside of the information board into the cross-flow cell (80) and back to the outside of the information board.

10. An information board according to claim 8, characterized in that it has at least one cooling fan (76) for generating an air flow cooling the cross-flow cell via the second air ducts of the cross-flow cell (80).

11. An information board according to claim 10, characterized in that on its opposing sides there are ventilation slots (78) for enabling air flow from the outside of the information board into the cross-flow cell (80) and back to the outside of the information board.

12. An information board according to claim 8, characterized in that on its opposing sides there are ventilation slots (78) for enabling air flow from the outside of the information board into the cross-flow cell (80) and back to the outside of the information board.

13. An information board according to claim 1, characterized in that it further comprises a heating device, such as an electric resistance, for warming the air flowing through the display casing (50) and the device casing (60).

14. An information board according to claim 13, characterized in that said heating device, such as an electric resistance, has been placed in the fan casing (70).

15. An information board according to claim 1, characterized in that the display casing (50) and the device casing (60) have been encased in a weatherproof manner for conducting the updating and maintenance measures taking place in outdoor conditions.

16. An information board according to claim 1, characterized in that the display element (30) is a TFT LCD display, a plasma display, a LED display or an organic LED display.

17. An information board according to claim 1, characterized in that its depth in the direction of the normal of the front plate is less than 25 cm.

18. An information board according to claim 1, characterized in that the dimensions of the display element (30) correspond to those of the paper posters used in illuminated advertisements.

* * * * *